United States Patent
Asano

(10) Patent No.: US 7,812,451 B2
(45) Date of Patent: Oct. 12, 2010

(54) SEMICONDUCTOR DEVICE AND METHOD OF MANUFACTURING THE SAME

(75) Inventor: Takashi Asano, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 211 days.

(21) Appl. No.: 12/107,391

(22) Filed: Apr. 22, 2008

(65) Prior Publication Data
US 2008/0258311 A1 Oct. 23, 2008

(30) Foreign Application Priority Data
Apr. 23, 2007 (JP) .............. 2007-113430

(51) Int. Cl.
*H01L 23/48* (2006.01)
(52) U.S. Cl. .......... 257/750; 438/652; 438/280; 438/619; 257/776; 257/E23.168
(58) Field of Classification Search .......... 257/750
See application file for complete search history.

(56) References Cited

U.S. PATENT DOCUMENTS

| 5,561,085 | A | | 10/1996 | Gorowitz et al. |
| 5,757,072 | A | | 5/1998 | Gorowitz et al. |
| 5,817,446 | A | * | 10/1998 | Lammert ............... 430/315 |
| 6,261,934 | B1 | * | 7/2001 | Kraft et al. ............ 438/592 |
| 6,268,262 | B1 | * | 7/2001 | Loboda ................. 438/422 |
| 6,504,189 | B1 | * | 1/2003 | Matsuda et al. ........ 257/275 |

FOREIGN PATENT DOCUMENTS

| JP | 5-152452 | 6/1993 |
| JP | 5-218213 | 8/1993 |
| JP | 6-89940 | 3/1994 |
| JP | 7-135251 | 5/1995 |
| JP | 8-236628 | 9/1996 |

* cited by examiner

*Primary Examiner*—Thao X Le
*Assistant Examiner*—Ajay K Arora
(74) *Attorney, Agent, or Firm*—Oblon, Spivak, McClelland, Maier & Neustadt, L.L.P.

(57) ABSTRACT

A semiconductor device includes a first wiring layer, a second wiring layer and a third wiring layer. The first wiring layer is formed on a semiconductor substrate. The second and the third wiring layer wiring layers are arranged in a direction intersecting with the first wiring layer on respective sides of the wiring layer. An air bridge wiring intersects the second and third wiring layers sandwiching an air layer above the first wiring layer therewith. The overall shape of the air bridge wiring has an upward convex curvature in an arch shape and the transverse sectional shape of the air bridge wiring is in the form of a downward concave curvature.

18 Claims, 9 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2007-113430, filed on Apr. 23, 2005; the entire contents of which are incorporated herein by reference.

TECHNICAL FIELD

The present invention relates to a semiconductor device using a compound semiconductor and, in particular, to a semiconductor device including a monolithic microwave integrated circuit.

BACKGROUND ART

Conventionally, in forming transmission lines intersecting with each other on a monolithic microwave integrated circuit (hereinafter referred to as "MMIC") having a GaAsFET as an active element, there has been widely used an air bridge wiring structure using air as an interlayer insulating material in order to reduce parasitic capacitance between wirings.

However, such a structure has the problem that in implementing layout with long wiring, a contact occurs between transmission lines or an air bridge wiring itself breaks, which results from an air bridge crushed because of static electricity, humidity, attraction of gravity, temperature, physical impact or dead weight of air bridge wiring itself. And hence MMIC may malfunction.

Also, if a metal film thickness of wiring is increased according to an air bridge wiring distance in order to avoid such a problem, manufacturing processes or labor time increase and hence loading on manufacturing machines and material costs increase, which causes a problem with manufacturing costs.

In view of the above problems, Japanese Patent Application Laid-Open No. 05-152452 has proposed a method to make the length of air bridge wiring short virtually by providing support pillars at regular intervals along the air bridge wiring in order to compensate for a long air bridge wiring length without need of changing a metal film thickness. However, this method has a following problem that the support pillars themselves become capacitor components resulting in excess floating capacitance, which is not preferable in design.

As a method for increasing mechanical strength of air bridge wiring itself, a method for forming a deflection-reinforcing member on the top of air bridge wiring has been disclosed in Japanese Patent Application Laid-Open No. 06-089940. In addition, a method for forming a sectional shape of an air bridge wiring into T, Π or H shape has been disclosed in Japanese Patent Application Laid-Open No. 05-218213. Further, a method for making widths of both ends of an air bridge wiring wider than that of the center portion of the air bridge wiring has been disclosed in Japanese Patent Application Laid-Open No. 07-135251.

However, such methods have a problem that manufacturing processes, labor time, loading on manufacturing machines and material costs increase, which causes a problem with manufacturing costs.

DISCLOSURE OF THE INVENTION

According to one aspect of the present invention, a semiconductor device includes a first wiring layer, a second layer and a third wiring layer. The first wiring layer is formed on a semiconductor substrate. The second and the third wiring layers are arranged in a direction intersecting with the first wiring layer on respective sides of the first wiring layer. The air bridge wiring interconnects the second and third wiring layers sandwiching an air layer above the first wiring layer therewith. The overall shape of the air bridge wiring has an upward convex curvature in an arch shape and the transverse sectional shape of the air bridge wiring is in the form of a downward concave curvature.

According to another aspect of the present invention, a method for manufacturing a semiconductor device starts with forming a first wiring layer over a semiconductor substrate. The method is followed by forming a second and a third wiring layers arranged in a direction intersecting with the first wiring layer on respective sides of the first wiring layer and forming a first resist layer that is formed on the first wiring layer formed between the second and third wiring layers. The method is further followed by forming the first resist layer that is formed on the first wiring layer formed between the second and the third wiring layers, forming openings for contact in the first resist layer at positions corresponding to end portions of the second and the third wiring layers and forming an air bridge wiring for interconnecting end portions of the second and the third wiring layers on the first resist layer using the lift off method. The method is further followed by removing the first resist layer under a high-temperature condition and cooling after the first resist layer is removed.

BRIEF DESCRIPTION OF THE DRAWINGS

FIGS. 2A and 2B are sectional views of the high-frequency semiconductor device illustrated in FIG. 1, wherein FIG. 2A is a sectional view taken along broken line X-X' of FIG. 1 and FIG. 2B is a sectional view taken along broken line Y-Y' of FIG. 1.

FIGS. 3A and 3B are process views for describing a manufacturing method of the high-frequency semiconductor device illustrated in FIG. 1, wherein FIG. 3A is a sectional view taken along broken line X-X' of FIG. 1 and FIG. 3B is a sectional view taken along broken line Y-Y' of FIG. 1.

FIGS. 4A and 4B are process views for describing a manufacturing method of the high-frequency semiconductor device illustrated in FIG. 1, wherein FIG. 4A is a sectional view taken along broken line X-X' of FIG. 1 and FIG. 4B is a sectional view taken along broken line Y-Y' of FIG. 1.

FIGS. 5A and 5B are process views for describing a manufacturing method of the high-frequency semiconductor device illustrated in FIG. 1, wherein FIG. 5A is a sectional view taken along broken line X-X' of FIG. 1 and FIG. 5B is a sectional view taken along broken line Y-Y' of FIG. 1.

FIGS. 6A and 6B are process views for describing a manufacturing method of the high-frequency semiconductor device illustrated in FIG. 1, wherein FIG. 6A is a sectional view taken along broken line X-X' of FIG. 1 and FIG. 6B is a sectional view taken along broken line Y-Y' of FIG. 1.

FIGS. 7A and 7B are process views for describing a manufacturing method of the high-frequency semiconductor device illustrated in FIG. 1, wherein FIG. 7A is a sectional view taken along broken line X-X' of FIG. 1 and FIG. 7B is a sectional view taken along broken line Y-Y' of FIG. 1.

FIGS. 8A and 8B are process views for describing a manufacturing method of the high-frequency semiconductor device illustrated in FIG. 1, wherein FIG. 8A is a sectional view taken along broken line X-X' of FIG. 1 and FIG. 8B is a sectional view taken along broken line Y-Y' of FIG.

FIGS. 9A and 9B are process views for describing a manufacturing method of the high-frequency semiconductor device illustrated in FIG. 1, wherein FIG. 9A is a sectional view taken along broken line X-X' of FIG. 1 and FIG. 9B is a sectional view taken along broken line Y-Y' of FIG. 1.

DETAILED DESCRIPTION OF THE INVENTION

A high-frequency semiconductor device as an embodiment of the present invention will be described in detail with reference to the accompanying drawings. In the following embodiment, description will be made on a semiconductor so called MMIC, which is a device manufactured according to a semiconductor process, as a high-frequency semiconductor device, but the present invention is not limited to MMIC and may be applied to a standard semiconductor device as well.

Figure 1:
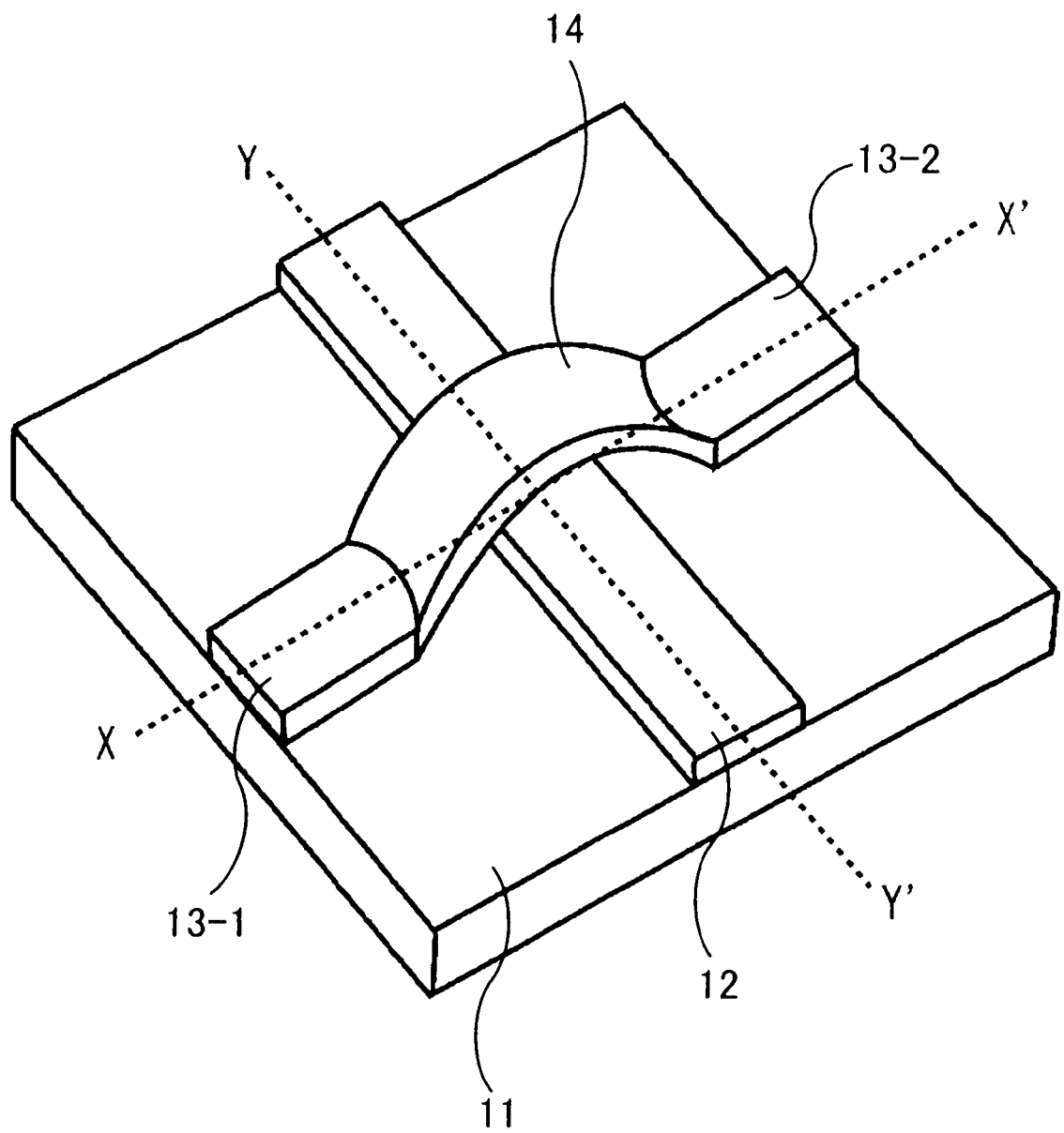
FIG. 1 is a perspective view for describing a bridge wiring structure in a high-frequency semiconductor device according to one embodiment of the present invention.
Figure 2A:
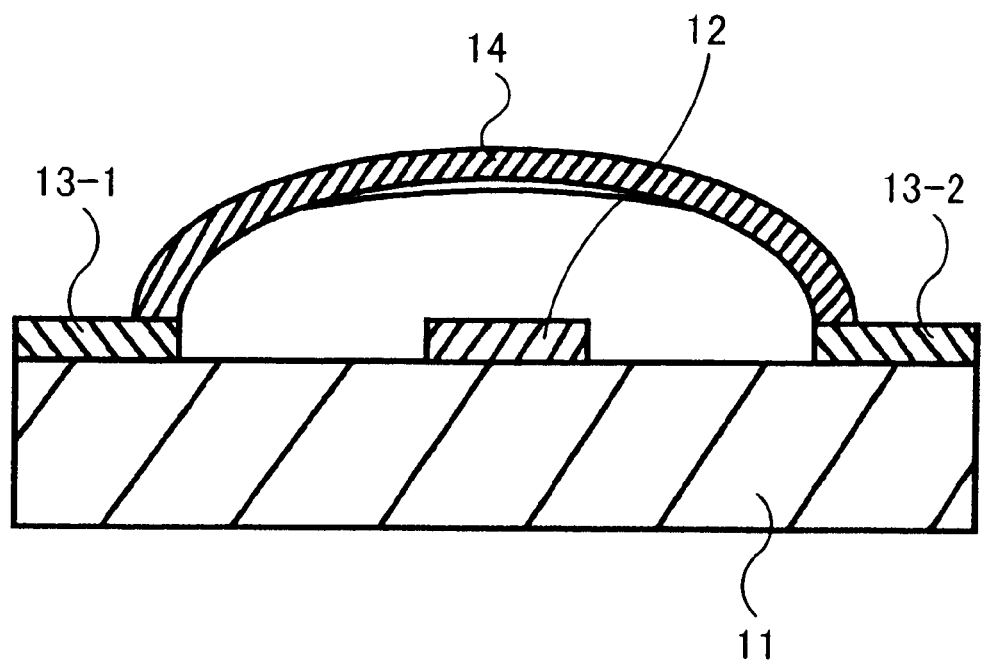
Figure 2B:
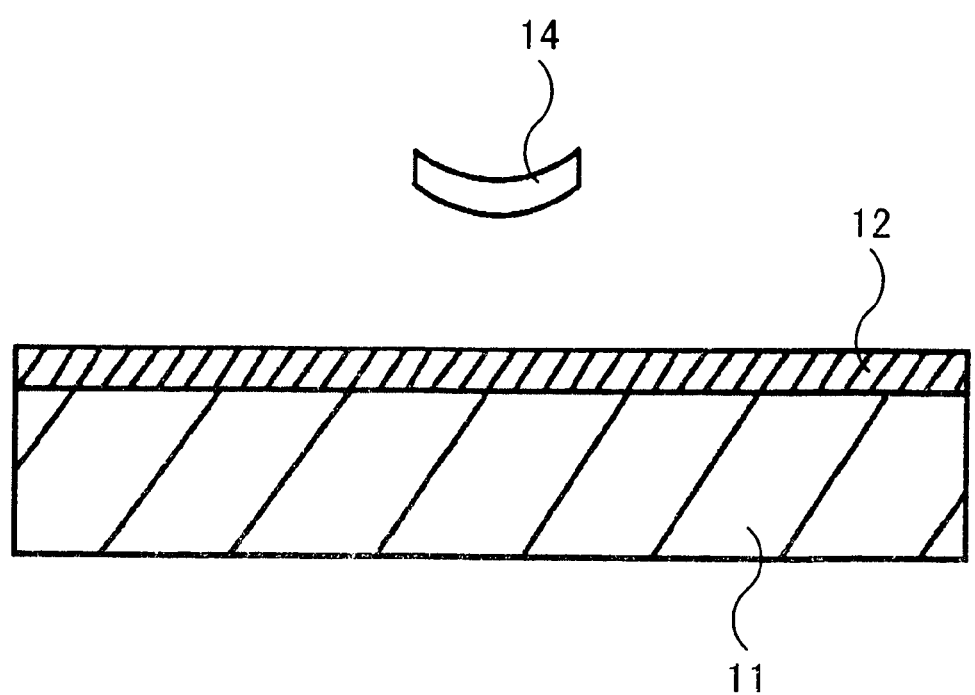

FIG. 1 is a perspective view of an air bridge wiring section in a high-frequency semiconductor device according to one embodiment of the present invention. FIG. 2 A and FIG. 2B are sectional views of the high-frequency semiconductor device illustrated in FIG. 1, wherein FIG. 2A is a sectional view taken along broken line X-X' of FIG. 1 and FIG. 2B is a sectional view taken along broken line Y-Y' of FIG. 1.

As illustrated in FIG. 1, the high-frequency semiconductor device includes a GaAs substrate 11, a first microstrip line 12 as a transmission line formed on the GaAs substrate 11, second microstrip lines 13-1, 13-2 each of which has an end portion arranged on either side of the first microstrip line 12 on the GaAs substrate 11, and an air bridge wiring 14 interconnecting the end portions of the second microstrip lines 13-1, 13-2. The high-frequency semiconductor device has such structure that allows suppression of floating capacitance between the lines by providing an air layer in between the first microstrip line 12 and the air bridge wiring 14. As illustrated in FIG. 2B, the cross section of at least the central portion of the air bridge wiring 14 is in a form of a downward concave curvature.

FIGS. 3A and 3B to FIGS. 9A and 9B are process views for describing a manufacturing method of the high-frequency semiconductor device having such a structure as described above. The respective views appended with A are sectional views taken along broken line X-X' of FIG. 1, while the respective views appended with B are sectional views taken along broken line Y-Y' of FIG. 1. The following processes use processes in a standard MMIC manufacturing process.

Figure 3A:
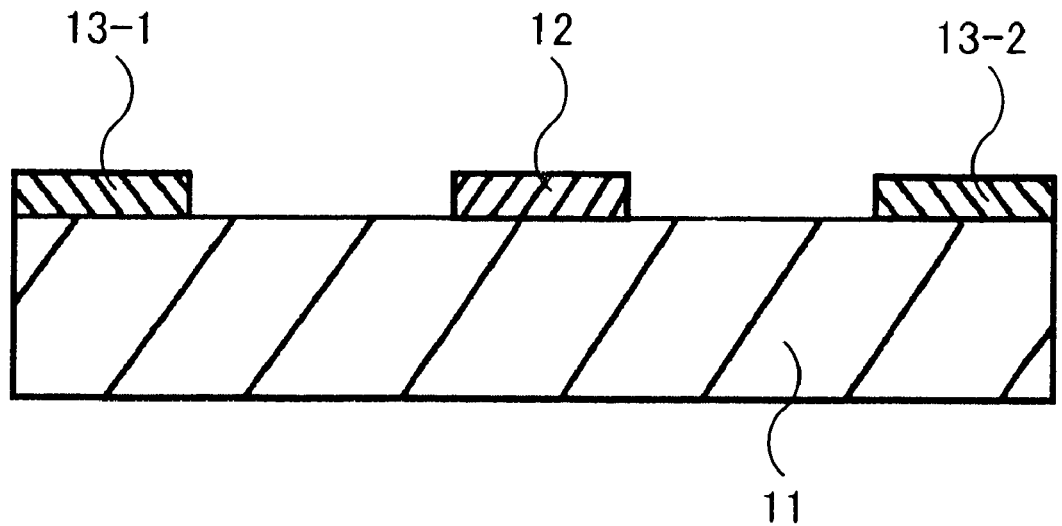
Figure 3B:
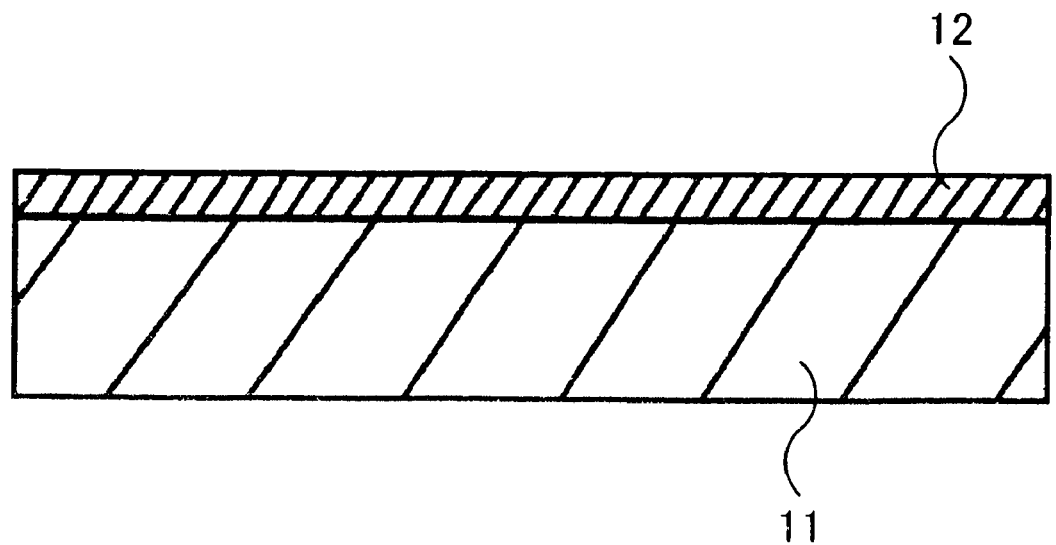

First, as illustrated in FIGS. 3A and 3B, the first microstrip line 12 and the second microstrip lines 13-1, 13-2 are formed on a surface of the GaAs substrate 11 using the lift off method. Specifically, although the following is not illustrated, after a resist layer is applied over the whole surface of the GaAs substrate 11, the GaAs substrate 11 is exposed with a pattern mask formed with a reverse pattern of the line patterns forming each of the first microstrip line 12 and the second microstrip lines 13-1, 13-2. More specifically, the mask with reverse pattern enables to expose to line pattern portions only and to remove the resist layer from the exposed portion by etching. Over the whole surface of the resist patterned in this way, Au, Pt and Ti are evaporated to thicknesses of 500 nm, 100 nm and 1,000 nm, respectively, for example, and then the whole of the GaAs substrate 11 is immersed into etching solution to peel off a metal evaporated layer except a targeted line pattern portion together with a resist layer using the lift off method to form the first microstrip line 12 and the second microstrip lines 13-1, 13-2.

Figure 4A:
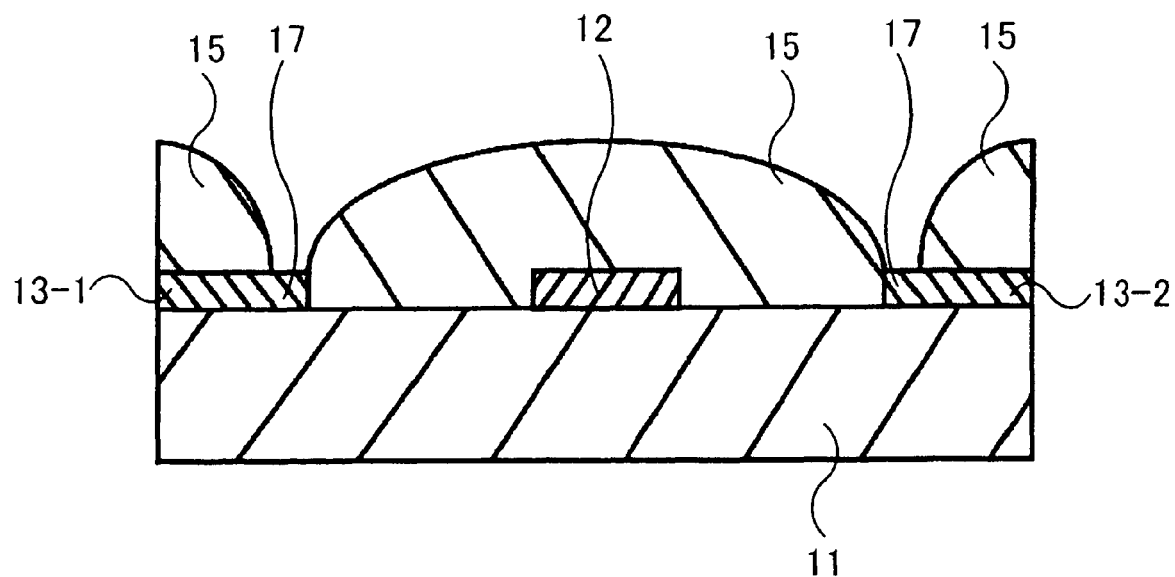
Figure 4B:
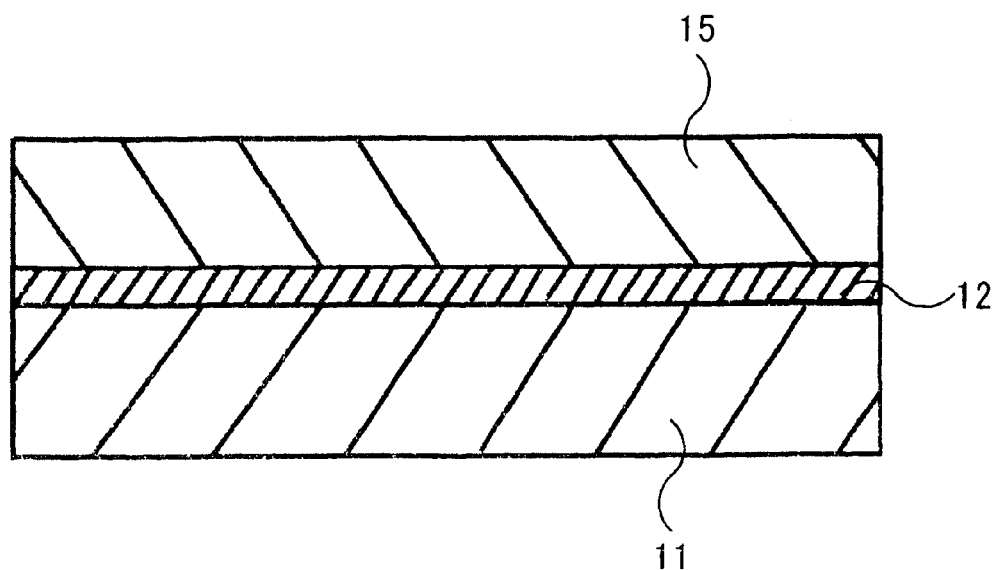

Next, a first resist layer 15 for forming the air bridge wiring 14 is applied over the whole surface of the substrate, and openings 17 for exposing the end portions of the second microstrip lines 13-1, 13-2 are formed as illustrated in FIGS. 4A and 4B by exposure using mask pattern and etching processing.

Figure 5A:
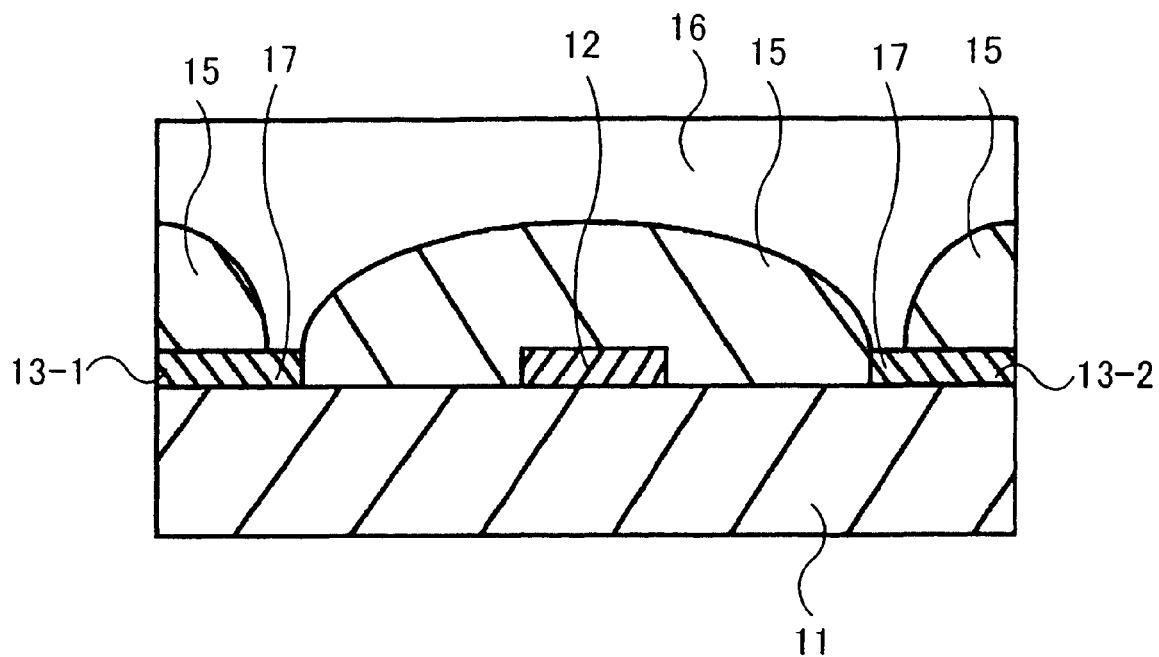
Figure 5B:
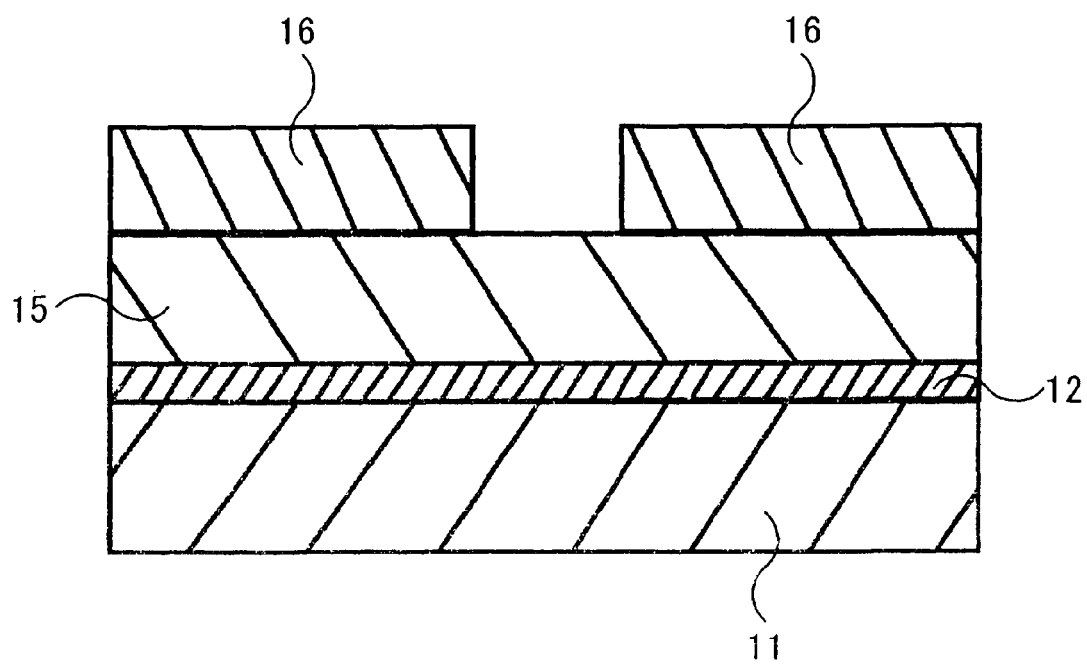

Next, after a resist layer 16 for the air bridge wiring 14 is applied over the whole surface of the first resist layer, a reverse pattern of the air bridge wiring 14 is formed on the second resist layer 16 as illustrated in FIGS. 5A and 5B by exposure and etching process.

Figure 6A:
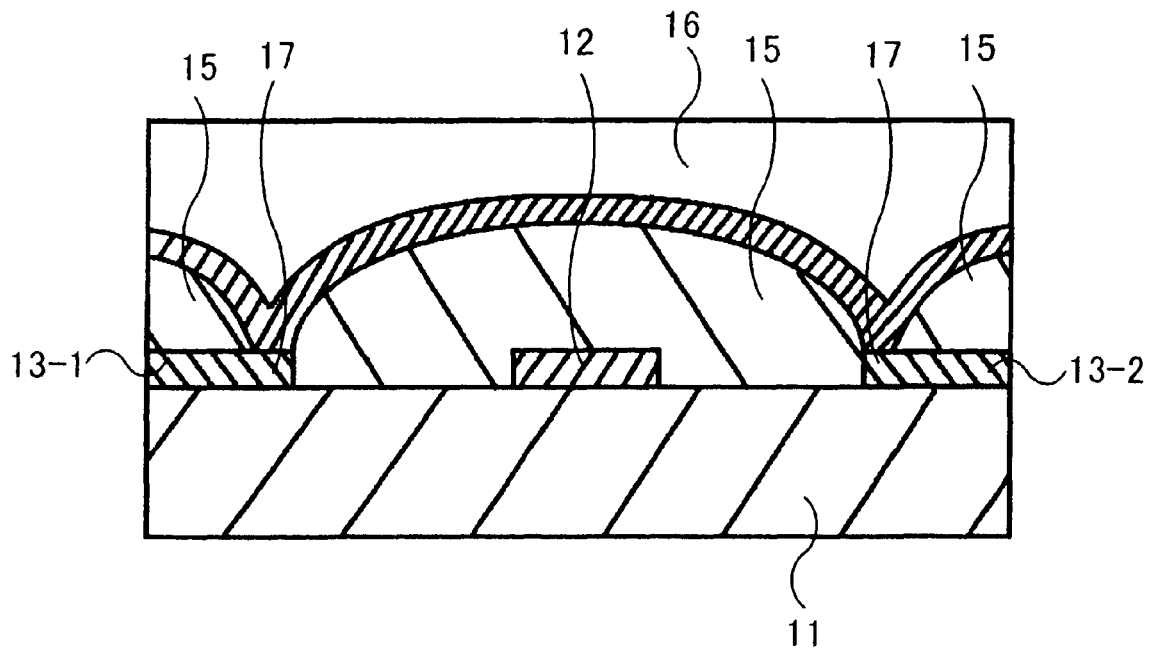
Figure 6B:
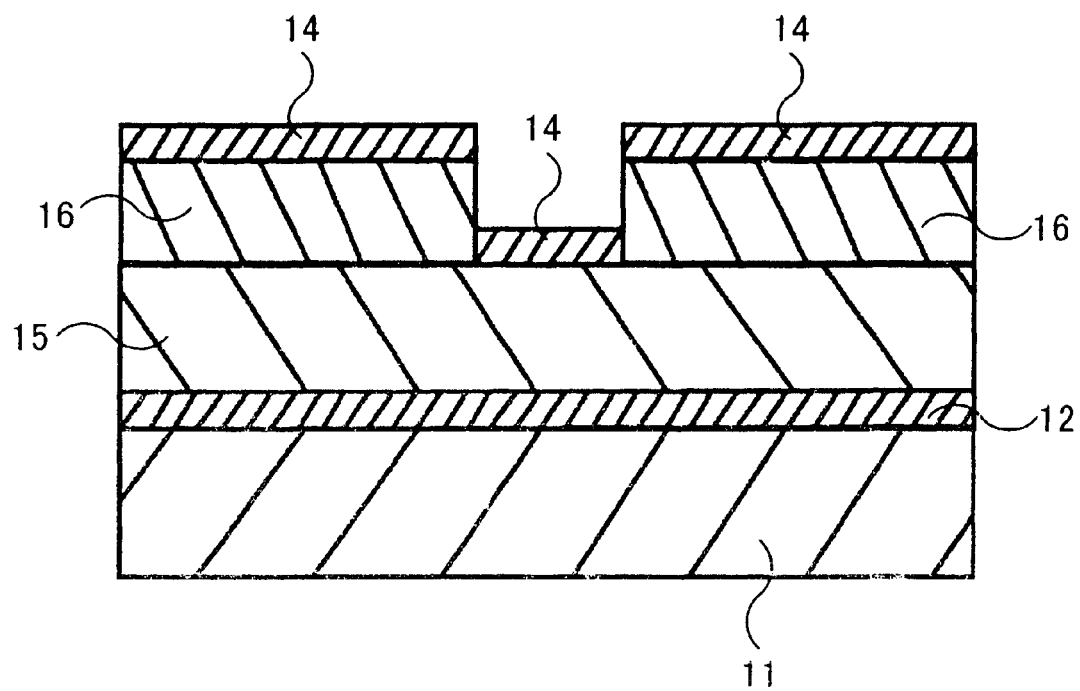

A conductive material for the air bridge wiring 14, such as Au is applied over the whole surface of the second resist layer 16 to a thickness of 1,000 nm as illustrated in FIG. 6B. The second resist layer 16 is subjected to the lift off method to form the air bridge wiring 14 as illustrated in FIGS. 7A and 7B.

Figure 7A:
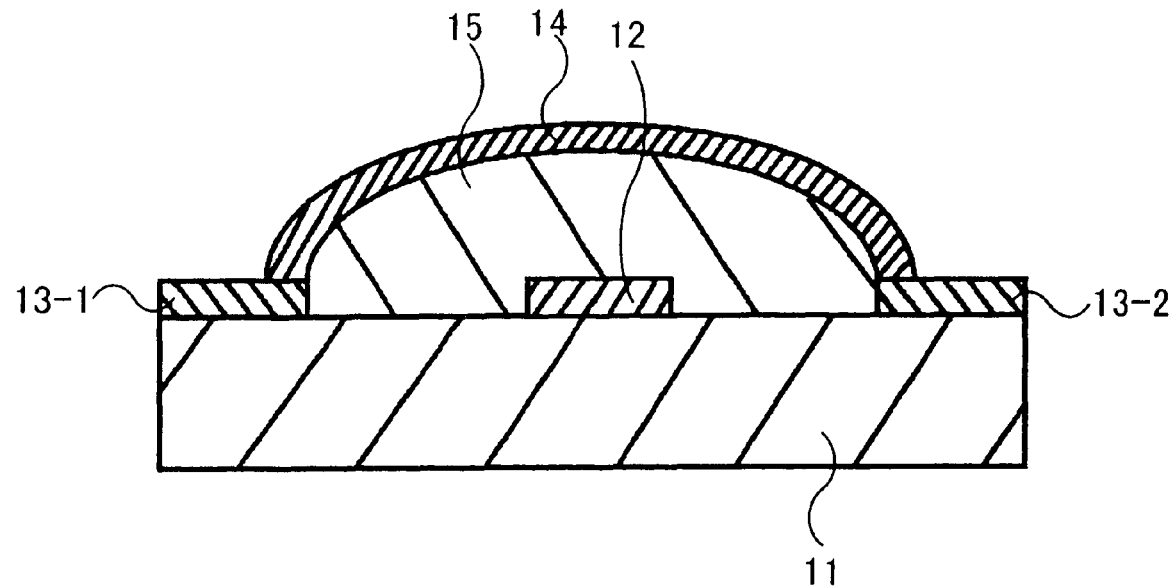
Figure 7B:
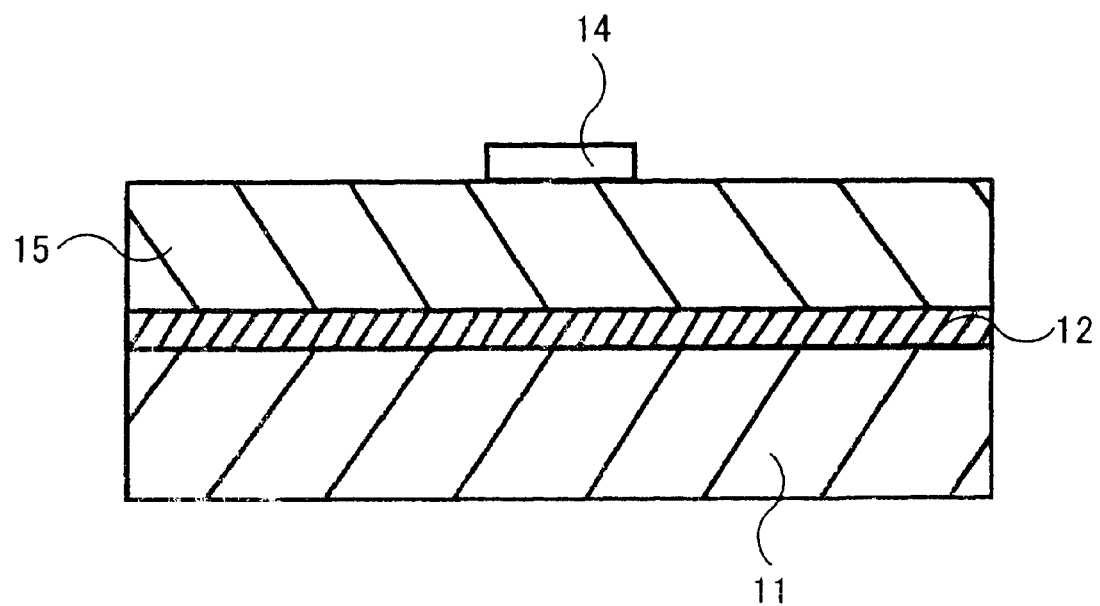

In such state, the first resist layer 15 still exists between the air bridge wiring 14 and the first microstrip line as illustrated in FIGS. 7A and 7B.

Figure 8A:
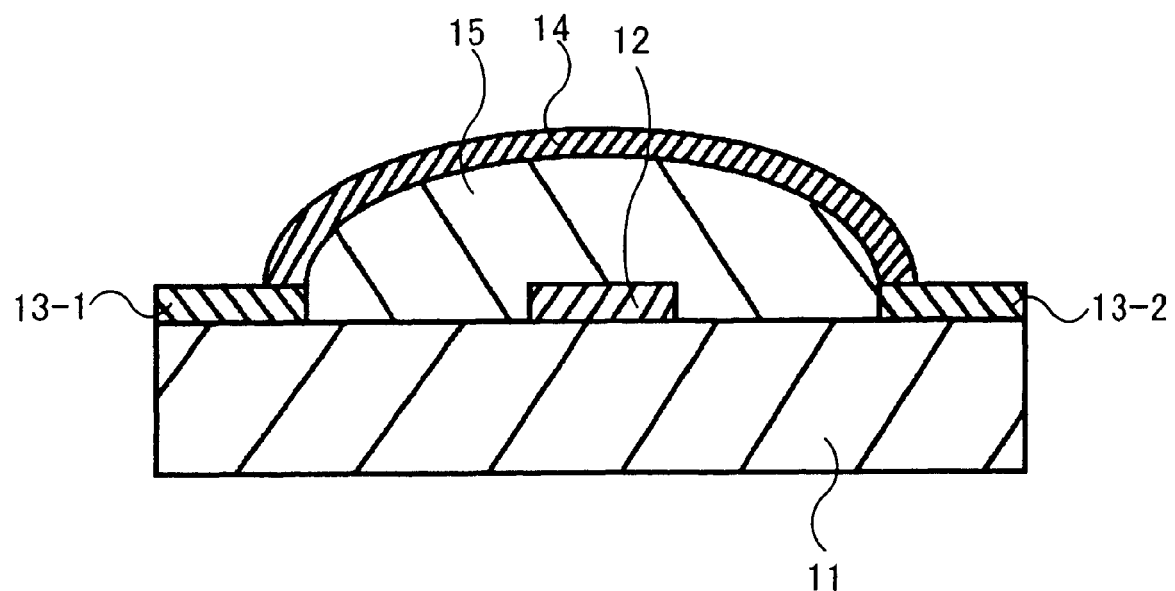
Figure 8B:
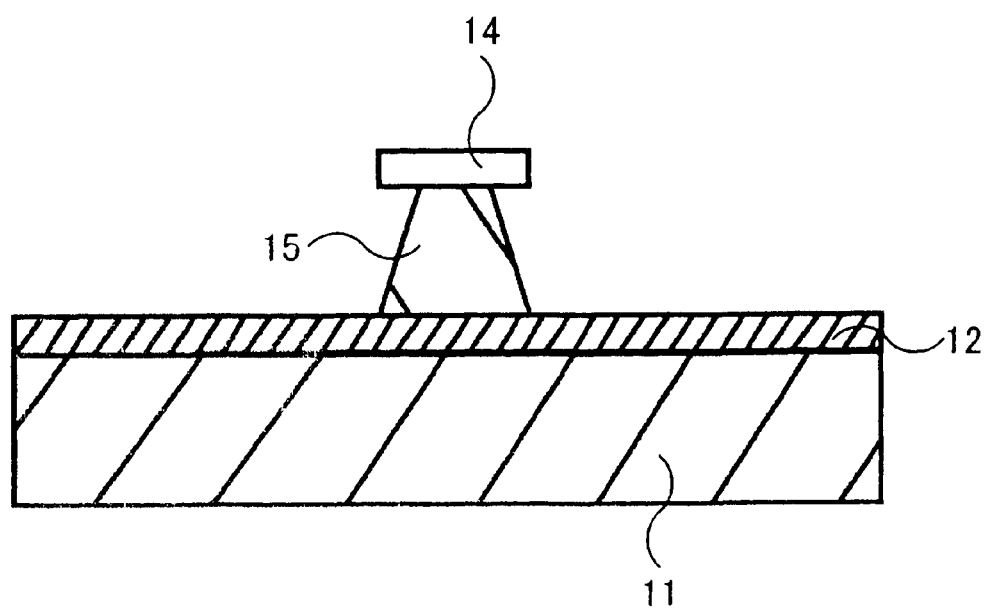

FIGS. 8A and 8B illustrate a process for ashing with $O_2$ radical to remove the first resist layer 15 existing between the air bridge wiring 14 and the first microstrip line 12.

Specifically, in this process, while the substrate 11 in the state illustrated in FIG. 8 is kept at a high temperature, for example, at 300° C. with a heater (not illustrated) or the like, ashing process is performed to remove the first resist layer 15. Since a thickness of the first resist layer 15 is approximately 3 μm, while a line width is approximately 10 μm, the first resist layer 15 is ashed starting from the edge side of the first microstrip line 12 and, the first resist layer 15 under the air bridge wiring 14 still remains even when the resist layer 15 on the peripheral is removed.

Figure 9A:
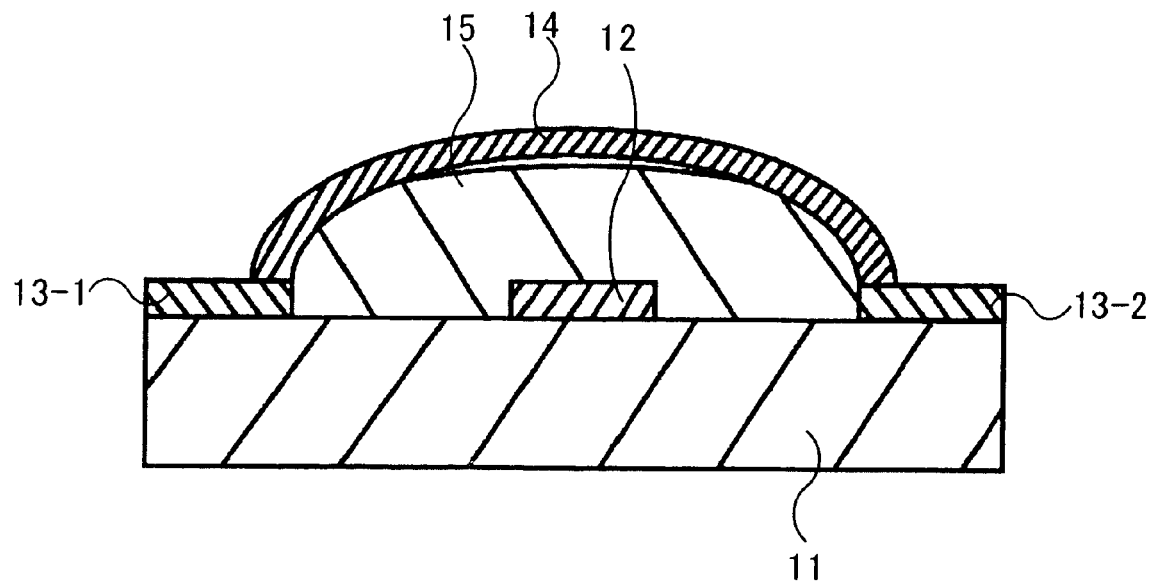
Figure 9B:
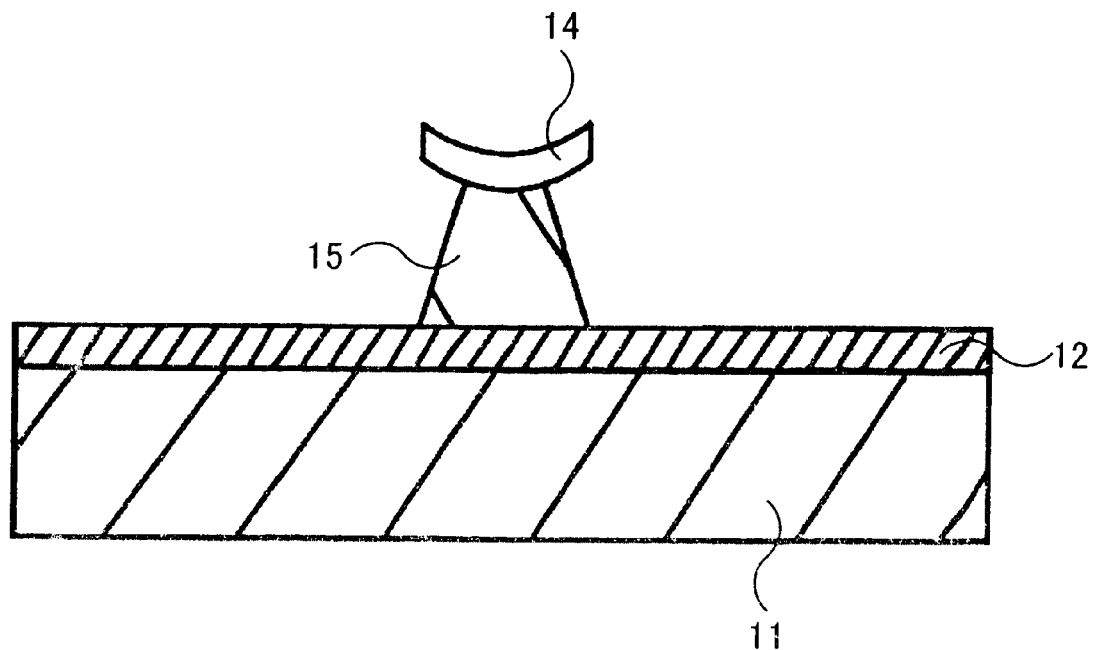

Since the air bridge wiring 14 is freed from adhesion to the first resist layer 15 sequentially toward the center from the edge of the air bridge wiring as illustrated in FIGS. 9A and 9B, Au is thermally expanded by a heat of 300° C. starting from the edge. Accordingly, a transverse cross section thereof is deflected to be in a form of a downward concave curvature as illustrated in FIG. 9B. Finally, the first resist layer 15 remaining under the air bridge wiring 14 is completely removed and then the substrate 11 is rapidly quenched to complete the structure illustrated in FIGS. 1, 2A and 2B.

According to such structure, since the transverse cross section of the air bridge wiring 14 is in the form of a downward concave curvature, the air bridge wiring 14 has high resistance against bending force and can avoid coming into contact with the first microstrip line 12 even when some force toward the substrate 11 works on the air bridge wiring 14.

The substrate temperature during ashing in the present embodiment is merely one example and, by controlling the temperature, the deflection degree of the wiring can be controlled, thus attaining a bridge shape having desirable mechanical strength.

The invention claimed is:
1. A semiconductor device comprising:
a first wiring layer formed on a semiconductor substrate;
a second and a third wiring layers arranged in a first direction intersecting with the first wiring layer on respective sides of the first wiring layer; and
an air bridge wiring for interconnecting the second and third wiring layers sandwiching an air layer above the first wiring layer therewith, wherein
the shape of the air bridge wiring in the first direction has an upward convex curvature in an arch shape and the transverse sectional shape of the air bridge wiring in a second direction perpendicular to the first direction is in the form of a downward concave curvature.

2. The semiconductor device according to claim 1, wherein the transverse sectional shape of at least the rising portions on both ends of the arch-shaped air bridge wiring is in the form of a downward concave curvature.

3. The semiconductor device according to claim 1, wherein the semiconductor substrate is GaAs substrate.

4. The semiconductor device according to claim 1, wherein the first to the third wiring layers are microstrip lines.

5. A method of manufacturing a semiconductor device comprising:
   a semiconductor substrate having top and bottom surfaces;
   forming a first wiring layer over the top surface of the semiconductor substrate;
   forming a second and a third wiring layers arranged in a first direction intersecting with the first wiring layer on respective sides of the first wiring layer;
   forming a first resist layer on the semiconductor substrate including the first to the third wiring layers;
   forming openings for contact on the first resist layer at positions corresponding to end portions of the second and the third wiring layers;
   forming an air bridge wiring for interconnecting end portions of the second and the third wiring layers on the first resist layer using the lift off method;
   removing the first resist layer under a high temperature condition and deflecting edges of the air bridge wiring to produce a downwardly concave transverse section in a second direction perpendicular to the first direction, and wherein downward points from the top surface to the bottom surface of the semiconductor substrate; and
   cooling after the first resist layer is removed.

6. The method of manufacturing the semiconductor device according to claim 5, wherein in forming the air bridge wiring, the air bridge wiring having a width larger than a thickness of the first resist layer, is formed.

7. The method of manufacturing the semiconductor device according to claim 5, wherein the conductive material is Au and the high temperature is approximately 300° C.

8. The method of manufacturing the semiconductor device according to claim 5, wherein the semiconductor substrate is a GaAs substrate.

9. The method of manufacturing the semiconductor device according to claim 5, wherein the first to the third wiring layers are microstrip lines.

10. A method of manufacturing a semiconductor device comprising:
    a semiconductor substrate having top and bottom surfaces;
    forming a first wiring layer over the top surface of the semiconductor substrate;
    forming a second and a third wiring layers arranged in a first direction intersecting with the first wiring layer on respective sides of the first wiring layer;
    forming a first resist layer on the semiconductor substrate including the first to the third wiring layers;
    forming openings for contact on the first resist layer at positions corresponding to end portions of the second and the third wiring layers;
    forming a second resist layer on the first resist layer;
    forming the second resist layer to have a reverse pattern of an air bridge wiring pattern for interconnecting end portions of the second and third wiring layers by exposure and etching;
    applying a conductive material for forming the air bridge wiring on the second resist layer onto front face thereof;
    forming the air bridge wiring by immersing the semiconductor substrate, which has the conductive material applied to the front face, into etching solution and by lifting off the conductive material applied to a portion except the air bridge wiring pattern;
    removing the first resist layer under a high temperature condition and deflecting edges of the air bridge wiring to produce a downwardly concave transverse section in a second direction perpendicular to the first direction, and wherein downward points from the top surface to the bottom surface of the semiconductor substrate; and
    cooling after the first resist layer is removed.

11. The method of manufacturing the semiconductor device according to claim 10, wherein in forming the air bridge wiring, the air bridge wiring having a width larger than a thickness of the first resist layer, is formed.

12. The method of manufacturing the semiconductor device according to claim 10, wherein the conductive material is Au and the high temperature is approximately 300° C.

13. The method of manufacturing the semiconductor device according to claim 10, wherein the semiconductor substrate is a GaAs substrate.

14. The method of manufacturing the semiconductor device according to claim 10, wherein the first to the third wiring layers are microstrip lines.

15. The method of manufacturing the semiconductor device according to claim 10, wherein removing the first resist comprises:
    exposing edges and a portion of a bottom surface of the air bridge wiring pattern while leaving a portion of the first resist under the air bridge wiring pattern.

16. The method of manufacturing the semiconductor device according to claim 10, wherein:
    applying the conductive material comprises forming the air bridge wiring to have a rectangular transverse section.

17. The method of manufacturing the semiconductor device according to claim 5, wherein removing the first resist comprises:
    exposing edges and a portion of a bottom surface of the air bridge wiring while leaving a portion of the first resist under the air bridge wiring.

18. The method of manufacturing the semiconductor device according to claim 5, wherein:
    applying the conductive material comprises forming the air bridge wiring to have a rectangular transverse section.

* * * * *

UNITED STATES PATENT AND TRADEMARK OFFICE
CERTIFICATE OF CORRECTION

| | |
|---|---|
| PATENT NO. | : 7,812,451 B2 |
| APPLICATION NO. | : 12/107391 |
| DATED | : October 12, 2010 |
| INVENTOR(S) | : Takashi Asano |

It is certified that error appears in the above-identified patent and that said Letters Patent is hereby corrected as shown below:

-- Column 1, line 9, change "Apr. 23, 2005" to -- Apr. 23, 2007 --

Signed and Sealed this
Seventeenth Day of May, 2011

David J. Kappos
*Director of the United States Patent and Trademark Office*